United States Patent
Lefaucheur et al.

(10) Patent No.: US 6,995,374 B2
(45) Date of Patent: Feb. 7, 2006

(54) SINGLE CRYSTAL SCINTILLATORS

(75) Inventors: Jean-Luc Lefaucheur, Motherwell (GB); Charles D. Brandle, Basking Ridge, NJ (US)

(73) Assignee: Photonic Materials Limited, Bellshill (GB)

( * ) Notice: Subject to any disclaimer, the term of this patent is extended or adjusted under 35 U.S.C. 154(b) by 282 days.

(21) Appl. No.: 10/409,612

(22) Filed: Apr. 9, 2003

(65) Prior Publication Data

US 2004/0200964 A1    Oct. 14, 2004

(51) Int. Cl.
*G01T 1/24* (2006.01)

(52) U.S. Cl. ............................ 250/370.11; 250/390.11; 250/483.1; 117/947; 252/301.33; 252/301.17; 252/301.4 R

(58) Field of Classification Search ........... 252/301.17, 252/301.33, 301.4 R; 117/947; 250/370.11, 250/390.11, 483.1
See application file for complete search history.

(56) References Cited

U.S. PATENT DOCUMENTS

| | | | |
|---|---|---|---|
| 5,242,620 A * | 9/1993 | Dole et al. | 252/301.4 R |
| 6,630,077 B2 * | 10/2003 | Shiang et al. | 252/301.4 R |
| 2004/0084655 A1 * | 5/2004 | Vartuli et al. | 252/301.4 R |

* cited by examiner

*Primary Examiner*—David Porta
*Assistant Examiner*—Christopher Webb
(74) *Attorney, Agent, or Firm*—Fleshner & Kim, LLP

(57) ABSTRACT

A single crystal scintillator with perovskite structure is described. The crystal is formed by crystallisation from the liquid and has the composition $$Ce_xLu_{(1-x-z)}A_zAl_{(1-y)}B_yO_3$$

where A is one or more of the elements selected from the group comprising Y, Sc, La, Pr, Nd, Sm, Eu, Gd, Tb, Dy, Ho, Er, Tm, Yb, In, and Ga; and B is one or more of the following elements selected from the group comprising: Sc and Ga. The crystal scintillator exhibits a high density and a good scintillation response to gamma radiation.

22 Claims, No Drawings

SINGLE CRYSTAL SCINTILLATORS

FIELD OF THE INVENTION

The present invention relates to the field radiation detection and more particularly to single crystal scintillation detectors for gamma rays, x-rays and like radiation.

BACKGROUND OF THE INVENTION

Transparent single crystal scintillators are well known in the art for use as detectors of gamma rays, x-rays, cosmic rays, other types of high energy radiation and energetic particles of approximately 1 KeV or above. When radiation is incident on the scintillator secondary photons are generated within the crystal. These secondary photons result from the interaction of the incident radiation and an activation ion contained within the crystal. Once produced, the secondary photons can be optically coupled to a photodetector so as to produce a voltage signal that is directly related to the number and amplitude of the secondary photons. Such crystal scintillators are typically employed for medical imaging such as Positron Emission Tomography (PET), digital radiography, mineral and petroleum exploration.

An ideal detector for the detection of the above radiation and particles employs a single crystal scintillator characterised in that it exhibits:

A high density so as to provide a high stopping power on the aforesaid radiation or particles;

A high light output, this results in the production of bright visible light, typically in the blue/UV region of the electromagnetic spectrum, in response to the absorption of the aforesaid radiation or particles;

A good energy resolution, which is an important characteristic as it allows good event identification, for example in PET applications;

A short decay time, associated with the ions excited by the aforesaid radiation or particles, so as to provide detectors with a fast response time; and A rugged structure so as to reduce the opportunity of accidental damage.

The Prior Art teaches of various single crystal scintillator materials that have been employed in an attempt to satisfy the above criteria. One of the earliest types of scintillator employed was Thallium doped Sodium Iodide (NaI:Tl). Although capable of producing very high light outputs and being relatively inexpensive to produce NaI:Tl exhibits an inherently low density and so has a low incident radiation absorption efficiency. In addition, NaI:Tl is hygroscopic, has a slow scintillation decay time and produces a large persistent afterglow that acts to impair the counting rate performance of the material.

Table 1 provides a summary of some of the main characteristics of NaI:Tl as well as other known scintillator materials. The data within this table are taken from papers and Patents that teach of the relevant crystals, as discussed below. It should be noted that:

The light output values are relative values measured relative to the light output of NaI:Tl;

The decay times are measured in nanoseconds and refer to the time it takes for a particular activation ion of a crystal scintillator to luminesce from the excited electronic state;

The density values are measured in g/cc;

The emission peak wavelengths are measured in nanometers; and

The melting point values are measured in ° C.

Inorganic metal oxides provide alternative single crystal scintillators devised for gamma ray detection and the like. For example a commonly employed inorganic metal oxide crystal is Bismuth Germanate (BGO). As well as being denser than NaI:Tl, BGO does not suffer from being hygroscopic. However, BGO scintillators have even slower scintillation decay times, exhibit lower light output levels that drop further with increasing temperatures and exhibit poor energy resolution values, as compared to NaI:Tl. In addition the refractive index values for BGO scintillators are relatively high so resulting in significant levels of light being lost through internal reflection processes within the crystal.

Attempts have been made to develop alternative single crystal scintillators that improve on the inherent characteristics of the aforementioned crystals. For example, Cerium activated Yttrium Orthosilicate (YSO) crystals have been developed while European Patent Application No. EP 0,231,693 teaches of a Cerium activated Gadolinium Orthosilicate (GSO) scintillator. The characteristic properties for both of these crystals are summarised in Table 1. Although exhibiting significantly faster scintillation decay times than NaI:Tl or BGO, both YSO and GSO have low densities. The light output and energy resolution values exhibited by YSO are generally good, however the inherent low density makes it a poor candidate for applications such as PET. GSO exhibits a lower light output than YSO but does have a higher density. However, the inherent poor mechanical properties of GSO make such crystals expensive to produce.

Another material that has been the subject of much development over the last few years is Cerium activated Lutetium Silicate (LSO) as taught in U.S. Pat. No. 4,958,080 and the equivalent European Patent No. 0,373,976. In particular LSO has become one of the most common crystals presently employed as a single crystal scintillator in PET as these crystals have good properties for such applications (see Table 1). LSO exhibits a fast scintillation decay time, has a fairly high density, high light output values and an average energy resolution. However, one main drawback of employing LSO as a single crystal scintillator is again the fact that it is an extremely expensive crystal to produce. This is due mainly to the fact that the melting point is very high (typically ~2100° C.) as compared to other standard oxide crystals.

Further single crystal scintillators have been developed in attempts to improve on the working characteristics of LSO while reducing the production costs. Such attempts concentrate exclusively on introducing a substitute ion at the site of the Lutetium ions within the original LSO structure. In particular U.S. Pat. No. 6,278,832 and the equivalent European Patent Application No. EP 1,004,899 teach of mixed Lutetium Orthosilicate crystals, commonly referred to as MLS crystals. Alternatively, U.S. Pat. No. 6,323,489 teaches of a single crystal of Cerium activated Lutetium Yttrium Oxyorthosilicate (LYSO). Both MLS crystals and LYSO crystals exhibit similar physical properties to LSO but are still expensive to produce since their melting point is only slightly lower that that of LSO.

A further restricting factor that is common to LSO, LYSO and MLS crystals is the fact that they all exhibit only average levels of energy resolution, compared to GSO or NaI:Tl.

U.S. Pat. No. 5,864,141 teaches of a high resolution gamma ray imaging device that employs a Yttrium Aluminium Perovskite (YAP) crystal scintillator while U.S. Pat. No. 5,864,141 teaches of a gamma ray detector based on a Yttrium Aluminium Perovskite (YAP) crystal. A YAP single crystal scintillator is found to exhibit very fast scintillation decay times and provide very good energy resolution and light output levels. However, YAP exhibits low density levels and is again an expensive crystal to produce. The fact that YAP has superior energy resolution than LSO is due to the fact that LSO exhibits a strong non-linearity of energy response which YAP does not suffer from. The superior energy resolution has been attributed to the perovskite structure.

An alternative single crystal scintillator to YAP that is also based on the Aluminium Perovskite structure, is LuAP, which has also been known to those skilled in the art for over a decade. For example, U.S. Pat. No. 5,961,714 teaches of a method of growing Cerium activated Lutetium Aluminium Perovskite (LuAP). LuAP crystal has a significant advantage over YAP in that it exhibits a much higher density and hence a higher stopping power. This characteristic makes LuAP extremely attractive as a gamma-ray scintillator and in particular for employment within PET applications.

The main drawback with LuAP is that it is extremely difficult to manufacture due to the fact that it is metastable at high temperature, which causes decomposition of the perovskite phase at high temperature. Therefore, to date attempts to manufacture LuAP have yielded only small size samples.

Research work has also been conducted on mixed Lutetium Yttrium Aluminium Perovskite crystals e.g. Cerium activated LuYAP, which is basically a mixed crystal of LuAP and YAP. Several references, such as:

"Growth and Light Yield Performance of Dense $Ce^{3+}$ doped $(Lu,Y)AlO_3$ Solid Solution Crystals", by Petrosyan et al, JCG 211 (2000) 252–256;

"Development of New Mixed $Lu(RE^{3+})$ AP:Ce Scintillator: Comparison With Other Ce Doped or Intrinsic Scintillating Crystals", by Cheval et al, Nuclear Inst. And methods in Phys. Res. A443 (2000) 331–341;

"Intrinsic Energy Resolution and Light Output of the Lu0.7Y0.3AP:Ce Scintillator", by Kuntner et al, Nuclear Inst; and Methods in Phys. Res. A 493 (2002) 131–136.

describe the physical properties of a LuYAP crystal that comprises 30% Yttrium and 70% Lutetium. This LuYAP crystal requires such a high level of Yttrium in order for it not to decompose at high temperatures. However, this results in a crystal that exhibits a density and stopping power that is significantly lower than LuAP. For example in the case of LuYAP with a 30% Yttrium level the crystal density becomes comparable with LSO, namely 7.468 g/cc. The decay time of such LuYAP crystals is about 25 ns but there also exists a significant long decay time component that is detrimental to applications where a fast crystal scintillator is preferred.

SUMMARY OF THE INVENTION

It is clearly desirable to be able to provide an affordable single crystal scintillator having as many of the aforementioned desirable properties as possible. Therefore, it is an object of at least one aspect of the present invention to provide a single crystal scintillator capable of detecting gamma rays, x-rays, cosmic rays and similar high energy radiation as well as energetic particles.

It is a further object of at least one aspect of the present invention to provide a single crystal scintillator that exhibits good working characteristics while remaining cost effective to produce.

According to a first aspect of the present invention there is provided a crystal scintillator comprising a transparent single crystal of a Cerium activated mixed Perovskite having a general formula $Ce_xLu_{(1-x-z)}A_zAl_{(1-y)}B_yO_3$, wherein x is within the range of from approximately 0.00005 to approximately 0.2, y is within the range of from 0.00005 to approximately 1.0, z is within the range of from 0 to approximately (1-x), where A comprises one or more of the following cations: Y, Sc, La, Pr, Nd, Sm, Eu, Gd, Tb, Dy, Ho, Er, Tm, Yb, In, Ga and B comprises one or both of the following cations: Sc and Ga.

According to a second aspect of the present invention there is provided a crystal scintillator comprising a transparent single crystal of a Cerium activated mixed Perovskite having a general formula $Ce_xLu_{(1-x-z)}A_zAl_{(1-y)}B_yO_3$, wherein x is within the range of from approximately 0.00005 to approximately 0.2, y is within the range of from 0.0 to approximately 1.0, z is within the range of from 0.00005 to approximately (1-x), where A comprises one or more of the following cations: Sc, La, Pr, Nd, Sm, Eu, Gd, Tb, Dy, Ho, Er, Tm, Yb, In and B comprises one or both of the following cations: Sc and Ga.

Most preferably A further comprises one or both of the following cations: Y and Ga.

Preferably x is within the range of from approximately 0.0005 to approximately 0.005, y is within the range of from 0.005 to approximately 0.05 and z is within the range of from 0.0005 to approximately 0.05.

Preferably the crystal scintillator has a luminescence decay time within the range of from approximately 15 ns to approximately 45 ns.

Preferably the crystal scintillator has a density of more than 7.5 g/cc.

Preferably the crystal scintillator generates a luminescence wavelength within the range of from approximately 330 nm to approximately 440 nm.

Preferably the crystal scintillator generates a luminescence wavelength of approximately 365 nm.

According to a third aspect of the present invention there is provided a scintillation detector comprising a crystal scintillator in accordance with the first or second aspect of the present invention and a photodetector optically coupled to said crystal scintillator for detecting light emitted from the crystal scintillator.

According to a fourth aspect of the present invention there is provided a scintillation detector comprising two or more a crystal scintillators and a photodetector optically coupled to said crystal scintillators for detecting light emitted from the crystal scintillators wherein at least one of the crystal scintillators comprises a crystal scintillator in accordance with the first or second aspect of the present invention.

Preferably the photodetector comprises a detector selected from the group comprising a photo-multiplier, a photo-diode and a charge-coupled device.

DETAILED DESCRIPTION OF THE INVENTION

Embodiments of the present invention will now be described, by way of example only and with reference to the accompanying Tables, in which:

Table 1 presents a summary of characterising properties for crystal scintillators taught in the Prior Art as compared with typical characteristics of a crystal scintillator in accordance with aspects of the present invention; and Table 2 presents a summary of chemical formulae and starting melts for crystal scintillators produced in accordance with aspects of the present invention.

TABLE 1

| | | | | | | | | | |
|---|---|---|---|---|---|---|---|---|---|
| Light Output | 100 | 20 | 40 | 20 | 40 | 50 | 25 | 25 | 40 |
| Energy Resolution | 7 | 19 | 7 | 11 | 6 | 14 | 7 | 7 | 7 |
| Decay Time (ns) | 230 | 300 | 40 | 30 | 28 | 40 | 18 | 25 | 20 |
| Density (g/cc) | 3.67 | 7.15 | 4.45 | 67 | 5.5 | 7.4 | 8.3 | 7.4 | 8.2–8.3 |
| Emission Peak (nm) | 415 | 480 | 420 | 440 | 380 | 428 | 365 | 365 | 365 |
| Melting Point (° C.) | 650 | 1050 | 1980 | 1900 | 1900 | 2100 | 1950 | 1950 | 1900 |
| Rugged | No | Yes | Yes | No | Yes | Yes | Yes | Yes | Yes |

TABLE 2

| | | |
|---|---|---|
| $Ce_{0.006}Lu_{0.894}Gd_{0.1}Al_{0.9}Sc_{0.1}O_3$ | $LuAlO_3$—$GdScO_3$ | 8.202 |
| $(Ce_{0.006})Lu_{(0.984)}Gd_{0.01}Al_{0.99}Sc_{0.01}O_3$ | $LuAlO_3$—$GdScO_3$ | 8.395 |
| $(Ce_{0.006})Lu_{(0.994)}La_{(0.05)}Al_{(0.95)}Ga(0.05)_{O3}$ | $LuAlO_3$—$LaGaO_3$ | 8.317 |
| $(Ce_{0.006})Lu_{(0.964)}La_{(0.03)}Al_{(0.97)}Ga_{(0.03)}O_3$ | $LuAlO_3$—$LaScO_3$ | 8.295 |
| $(Ce_{0.006})Lu_{(0.894)}La_{(0.10)}Al_{(0.9)}Ga_{(0.1)}O_3$ | $LuAlO_3$—$LaGaO_3$ | 8.258 |
| $(Ce_{0.006})Lu_{(0.914)}La_{0.08}AlO_3$ | $LuAlO_3$—$LaAlO_3$ | 8.229 |
| $(Ce_{0.006})Lu_{(0.974)}Y_{0.02}Al_{0.98}Ga_{0.02}O_3$ | $LuAlO_3$—$YGaO_3$ | 8.307 |
| $(Ce_{0.006})Lu_{(0.974)}Y_{0.02}Al_{0.98}Sc_{0.02}O_3$ | $LuAlO_3$—$YScO_3$ | 8.307 |

In order to produce a commercially viable crystal scintillator it is necessary to develop a material that can be produced by a standard growth process. The following embodiments of the present invention employ the Czochralski growth method to produce the crystal scintillators, although any other growth method may be employed. The Czochralski growth method is described in detail by C. D. Brandle in a paper entitled *"Czochralski Growth of Rare-Earth Orthosilicates ($Ln_2SiO_5$)"* published in the Journal of Crystal Growth, Volume 79, Page 308–315, (1986).

A further criterion for a commercially viable crystal scintillator is that it should be physically stable at high temperature, a criterion that is currently lacking in LuAP. By substituting a critical amount of Lu or Al by different trivalent cations, the Perovskite structure can be stabilised so as to prevent metastability of the material at high temperature.

The lack of stability in LuAP can be related to the Goldschmidt tolerance factor that is a measure of the geometric fit of the various atoms based on a hard sphere model and is defined by:

$$t = (R_A + R_o)/(\sqrt{2}(R_B + R_o)) \quad (1)$$

where $R_A$ = radius of the larger cation, e.g. Lu $R_B$ = radius of the smaller cation, e.g. Al $R_o$ = radius of the oxygen anion, i.e. 1.4 Å

As t becomes larger, i.e. approaches unity, the tendency for stability of the Perovskite structure increases. For a given B cation, e.g. Al, the increase in the tolerance factor is also reflected in the unit cell volume. The condition for better stability at high temperature is to have an approximate value for the critical unit cell volume ranging from about 198.7 Å$^3$ to 201.3 Å$^3$.

Example Lutetium Mixed Perovskite Crystal Scintillators

In a particular example (a solid solution of $LuAlO_3$ and $GdScO_3$) is employed to produce a transparent single crystal scintillator, grown by the Czochralski growth method, having a formula:

$Ce_{0.006}Lu_{0.894}Gd_{0.1}Al_{0.9}Sc_{0.1}O_3$

Initially the following chemical substances (with respective weights): $Lu_2O_3$ (711.5 g), $Gd_2O_3$ (72.5 g), $Al_2O_3$ (183.9 g), $Sc_2O_3$ (27.6 g) and $CeO_2$ (4.12 g) are loaded into an iridium crucible. The crucible is then loaded into a growth furnace composed of Zirconia insulation and heated by an induction coil under an inert atmosphere containing a small amount of oxygen, typically less than 2%, to prevent evaporation of the various components. The crystal is then pulled from the melt at a slow rate, typically 1 mm/h to 2 mm/h, and using a rotation rate from 10 to 30 rpm. This method provides a crystal scintillator having a density of 8.202 g/cc (see Table 2), the other characterising parameters are as shown in Table 1.

Further examples of physically stable crystal scintillators grown by the aforementioned Czochralski growth method are presented in Table 2. The starting melt compositions shown were employed since these melts are found to be stable at high temperatures.

It should also be pointed out that for each of the solid solutions, the "dopant perovskite" e.g. $GdScO_3$, $LaAlO_3$ and $YScO_3$ is in itself a congruent melting compound and hence a stable compound.

Seven of the Lutetium Mixed Perovskite crystals described in Table 2 produce Cerium activated Lutetium Mixed Perovskite scintillators where cation substitution has taken place at the Aluminium host sites. In all of the scintillators described in Table 2 a second cation, in addition to the Cerium cations, have been substituted at the Lutetium ions host sites. This has been carried out so as to provide an alternative activation ion and to aid in the chemical stability of the Lutetium Mixed Perovskite crystals.

The described Lutetium Mixed Perovskite crystals provide a number of clear advantages when compared to other materials described in the Prior Art such as LSO, LuAP or YAP (see Table 1), both from a growth process point of view and a performance point of view.

Compared with LuAP, the multiple ionic substitutions employed to modify the physical structure improve the thermal stability of the material. This improved thermal stability renders the growth process scalable to commercial levels since it permits improved yields. Such yields are not readily feasible for LuAP due to the inherent metastability of this material at high temperatures.

The decay time of the described Lutetium Mixed Perovskite crystals, like other perovskite materials (LuAP, YAP), are shorter than LSO. In addition the energy resolution values of these crystals are also of a more advantageous value for use as a scintillator material when compared with those for LSO.

It should also be noted that the higher density and stopping power of the described Lutetium Mixed Perovskite crystals provide these materials with a significant advantage in their use as a crystal scintillator when compared to the typical values associated with both YAP and LuYAP.

The aforementioned crystal scintillators can be readily modified to form a scintillator detector. This is achieved by simply optically coupling one or more of the crystal scintillators to a photodetector. The photodetector then provides an output electrical voltage in response to the secondary photons produced within the crystal scintillators themselves created in response to the absorption of the incident gamma rays, x-rays or high energy particles. A wide variety of photodetectors may be employed and a variety of coupling methods used, as is well known in the art.

In an alternative embodiment the scintillator detector may comprise one or more crystal scintillators, as described above, and one or more crystal scintillators as taught in the Prior Art. All of these crystal scintillators are then coupled to one or more photodetectors, as described previously.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention herein intended.

What is claimed is:

1. A crystal scintillator comprising a transparent single crystal of a Cerium activated mixed Perovskite having a general formula $$Ce_xLu_{(1-x-z)}A_zAl_{(1-y)}B_yO_3,$$

wherein
x is within the range of from approximately 0.00005 to approximately 0.2,
y is within the range of from 0.00005 to approximately 1.0,
z is within the range of from 0 to approximately (1-x),
where A comprises one or more of the following cations: Y, Sc, La, Pr, Nd, Sm, Eu, Gd, Tb, Dy, Ho, Er, Tm, Yb, In, Ga and
B comprises one or both of the following cations: Sc and Ga.

2. A crystal scintillator as claimed in claim 1 wherein x is within the range of from approximately 0.0005 to approximately 0.005.

3. A crystal scintillator as claimed in claim 1 wherein y is within the range of from 0.005 to approximately 0.05.

4. A crystal scintillator as claimed in claim 1 wherein z is within the range of from 0.0005 to approximately 0.05.

5. A crystal scintillator as claimed in claim 1 wherein the crystal scintillator has a luminescence decay time within the range of from approximately 15 ns to approximately 45 ns.

6. A crystal scintillator as claimed in claim 1 wherein the crystal scintillator has a density of more than 7.5 g/cc.

7. A crystal scintillator as claimed in claim 1 wherein the crystal scintillator generates a luminescence wavelength within the range of from approximately 330 nm to approximately 440 nm.

8. A crystal scintillator as claimed in claim 7 wherein the crystal scintillator generates a luminescence wavelength of approximately 365 nm.

9. A scintillation detector comprising a crystal scintillator as claimed in claim 1 and a photodetector optically coupled to said crystal scintillator for detecting light emitted from the crystal scintillator.

10. A scintillation detector comprising two or more a crystal scintillators and a photodetector optically coupled to said crystal scintillators for detecting light emitted from the crystal scintillators wherein at least one of the crystal scintillators comprises a crystal scintillator as claimed in claim 1.

11. A crystal scintillator comprising a transparent single crystal of a Cerium activated mixed Perovskite having a general formula $$Ce_xLu_{(1-x-z)}A_zAl_{(1-y)}B_yO_3,$$

wherein
x is within the range of from approximately 0.00005 to approximately 0.2,
y is within the range of from 0.0 to approximately 1.0,
z is within the range of from 0.00005 to approximately (1-x),
where A comprises one or more of the following cations: Sc, La, Pr, Nd, Sm, Eu, Gd, Tb, Dy, Ho, Er, Tm, Yb, In and
B comprises one or both of the following cations: Sc and Ga.

12. A crystal scintillator as claimed in claim 11 wherein A further comprises one or both of the following cations: Y and Ga.

13. A crystal scintillator as claimed in claim 11 wherein x is within the range of from approximately 0.0005 to approximately 0.005.

14. A crystal scintillator as claimed in claim 11 wherein y is within the range of from 0.005 to approximately 0.05.

15. A crystal scintillator as claimed in claim 11 wherein z is within the range of from 0.0005 to approximately 0.05.

16. A crystal scintillator as claimed in claim 11 wherein the crystal scintillator has a luminescence decay time within the range of from approximately 15 ns to approximately 45 ns.

17. A crystal scintillator as claimed in claim 11 wherein the crystal scintillator has a density of more than 7.5 g/cc.

18. A crystal scintillator as claimed in claim 11 wherein the crystal scintillator generates a luminescence wavelength within the range of from approximately 330 nm to approximately 440 nm.

19. A crystal scintillator as claimed in claim 11 wherein the crystal scintillator generates a luminescence wavelength of approximately 365 nm.

20. A scintillation detector comprising a crystal scintillator as claimed in claim 11 and a photodetector optically coupled to said crystal scintillator for detecting light emitted from the crystal scintillator.

21. A scintillation detector comprising two or more crystal scintillators and a photodetector optically coupled to said crystal scintillators for detecting light emitted from the crystal scintillators wherein at least one of the crystal scintillators comprises a crystal scintillator as claimed in claim 11.

22. A scintillation detector as claimed in claims 9 20, 10, or 21 wherein the photodetector comprise a detector selected from the group comprising a photomultiplier, a photo-diode and a charge-coupled device.

* * * * *